US006765426B1

(12) United States Patent
Ajit (10) Patent No.: US 6,765,426 B1
(45) Date of Patent: Jul. 20, 2004

(54) METHODS AND SYSTEMS FOR LIMITING SUPPLY BOUNCE

(75) Inventor: Janardhanan S. Ajit, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/638,292

(22) Filed: Aug. 12, 2003

Related U.S. Application Data

(63) Continuation of application No. 10/183,450, filed on Jun. 28, 2002, now Pat. No. 6,608,519.
(60) Provisional application No. 60/357,847, filed on Feb. 21, 2002.

(51) Int. Cl.[7] .................................................. H03K 5/08
(52) U.S. Cl. ........................................ 327/379; 326/87
(58) Field of Search .............................. 326/26, 27, 31, 326/87; 327/112, 379, 403, 404

(56) References Cited

U.S. PATENT DOCUMENTS

| 5,786,709 A | 7/1998 | Kirsch et al. |
| 6,184,729 B1 | 2/2001 | Pasqualini |
| 6,396,301 B1 | 5/2002 | Wallace, Jr. et al. |

Primary Examiner—Jeffrey Zweizig
(74) Attorney, Agent, or Firm—Sterne, Kessler, Goldstein & Fox P.L.L.C.

(57) ABSTRACT

Methods and systems for limiting power supply and ground bounce enables control of the output current drive dependent on the changes in supply (VDD and GND) levels. This is made possible by making the gate drive of the output driver PMOS and NMOS dependent on the VDD and GND swings. When the VDD or GND increases above normal operating levels, the gate drive of the output driver PMOS is reduced and when the GND or VDD reduces below normal operating levels, the gate drive of the output driver NMOS is reduced. This leads to reduced current flow between the supplies and the pad thereby reducing the VDD and GND bounce problem.

15 Claims, 4 Drawing Sheets

METHODS AND SYSTEMS FOR LIMITING SUPPLY BOUNCE

CROSS-REFERENCE TO RELATED APPLICATIONS

This application is a continuation of U.S. application Ser. No. 10/183,450, filed Jun. 28, 2002, titled "Methods and Systems for Limiting Supply Bounce," (to be issued as U.S. Pat. No. 6,608,519 on Aug. 19, 2003), which claims priority to U.S. Provisional Application No. 60/357,847, filed Feb. 21, 2002, titled "Methods and Systems for Limiting Supply Bounce," both of which are incorporated herein by reference in their entireties.

BACKGROUND OF THE INVENTION

1. Field of the Invention

The present invention is directed to methods and systems for limiting supply bounce, such as power supply and/or ground bounce.

2. Background Art

There is a trend towards increasing the number of digital I/O pads on integrated circuits ("ICs") to increase the integrated functionality and the number of bits of data processed. When multiple digital I/O pads switch simultaneously, currents in supply (power supply and/or ground) lines associated with the digital I/O pads tend to vary with time. Such transient current changes interact with supply line inductances to cause excursions in supply voltages. Thus supply (power supply and/or ground) voltages may oscillate above and/or below normal levels. This is called supply bounce or VDD/GND bounce. The increase of positive power supplies above normal operating levels and the decrease of ground below normal operating levels leads to relatively large amounts of current flow between the power supplies and pads. This limits the number of output pads which can simultaneously switch at any given time.

Methods and systems are therefore needed to limit supply bounce.

BRIEF SUMMARY OF THE INVENTION

The present invention is directed to methods and systems for limiting supply (power supply and/or ground) bounce. The invention enables control of output current drive dependent on changes in supply levels.

In accordance with the invention, gate drives of output drivers (e.g, PMOS and/or NMOS output drivers) are varied according to supply swings. For example, when a power supply, VDD, or a ground supply, GND, voltage increases above normal operating levels, the gate drive of a PMOS output driver is reduced. When a ground supply, GND, or VDD power supply voltage falls below normal operating levels, the gate drive of an NMOS output driver is reduced. This leads to reduced current flow between the supplies and the pad, thereby reducing supply bounce.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The present invention will be described with reference to the accompanying drawings. The drawing in which an element first appears is typically indicated by the leftmost digit(s) in the corresponding reference number.

DETAILED DESCRIPTION OF THE INVENTION

Figure 1:
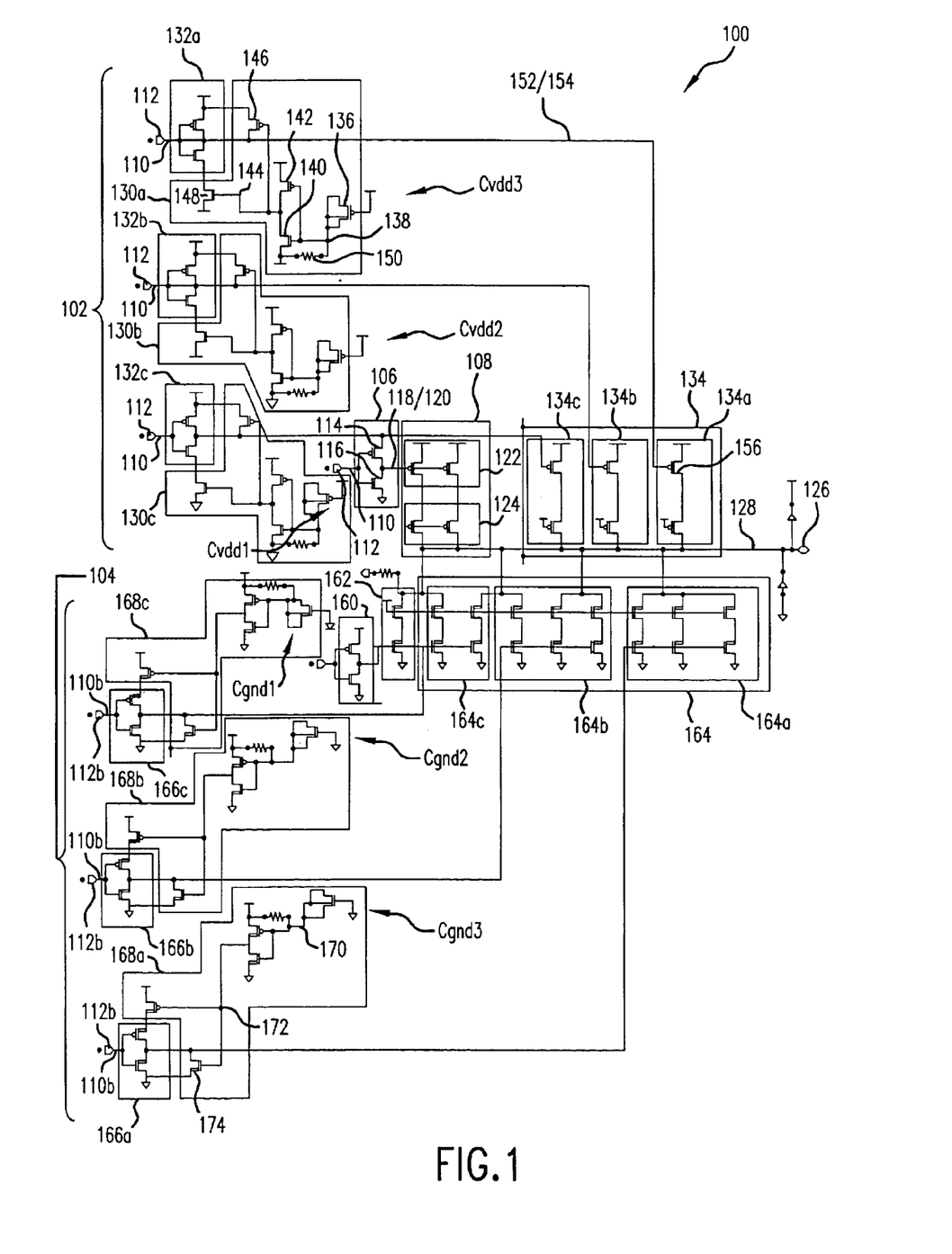
FIG. 1 is a schematic diagram of an example output circuit 100 for limiting supply bounce in accordance with the invention.

FIG. 1 illustrates a VDD and falling edge output circuit ("output circuit") 100 in accordance with the present invention. The output circuit 100 includes a rising edge portion 102 and a falling edge portion 104. The rising edge portion 102 and the falling edge portion 104 can be implemented together as illustrated in FIG. 1, or independent of one another. Rising edge portion 102 is now described.

Rising edge portion 102 includes primary buffer circuitry 106 and a primary output driver 108. In the example of FIG. 1, the primary buffer circuitry 106 includes an inverter formed by a PMOS device 114 and an NMOS device 116. The primary buffer circuitry 106 receives an input waveform 110 from an input terminal 112 and outputs a primary output driver waveform 118 on a primary output driver control line 120. The primary output driver waveform 118 is an inverted representation of the input waveform 110.

The primary output driver waveform 118 is received by the primary output driver 108. In the example of FIG. 1, the primary output driver 108 includes one or more PMOS driver devices 122 and one or more optional PMOS protection devices 124. The one or more optional PMOS protection devices 124 have gate terminals coupled to a relatively low supply, illustrated here as VDDC or ground, and are thus constantly turned on. This couples drain terminals of the PMOS driver devices 122 to the output terminal 126 via a common bus 128.

The primary output line 120 from the primary buffer circuitry 106 controls gate terminals of the PMOS driver devices 122. In operation, as the input waveform 110 rises, the primary output driver waveform 118 falls, which controls the PMOS driver devices 122 to couple a positive supply VDD to the output terminal 126. In other words, the rising edge portion 102 causes rising edges of the input waveform 110 to appear at the output terminal 126.

An analogous portion of the falling edge portion 104 is now described. The falling edge portion 104 includes primary buffer circuitry 160 and a primary output driver 162. The primary buffer circuitry 160 is configured similar to the primary buffer circuitry 106. The primary output driver 162 is configured similar to the primary output driver 108, but is coupled between a ground supply, GND, and the output terminal 126 via the common bus 128. In operation, as the input waveform 110b falls, the primary buffer circuitry 162 controls the primary output driver 160 to pull-down the output terminal 126. In other words, the falling edge portion 104 causes falling edges of the input waveform 110b to appear at the output terminal 126.

Under ideal conditions, the above described portions of the rising edge portion 102 and the falling edge portion 104 are satisfactory for driving the output terminal 126. In many applications, however, the positive supply voltage VDD and/or the ground, GND, are used to supply other output circuits as well. As switching circuits coupled to the supply lines switch on and/or off around the same time that the primary output driver 108 and/or the primary output driver 162 switches on and/or off, the current drawn from the positive supply VDD and/or drawn by the ground GND, can change relatively sharply with time. This transient change of current interacts with inductances in the supply lines, leading to relatively large excursions in supply voltage, i.e., VDD and/or GND. In other words, as additional output circuits are coupled to the VDD supply, the VDD supply voltage may oscillate above normal levels. This is called VDD bounce. Similarly, as additional output circuits are coupled to the GND supply, the GND level may oscillate below normal levels. This is called GND bounce.

The increase of VDD above normal operating levels and/or the decrease of GND below normal operating levels can lead to relatively large amounts of current flow between the output pads, such as output terminal 126, and the VDD power supply and/or GND. This can transfer noise to load circuits coupled to the output terminal 126, which can have unpredictable affects on the load circuits. In extreme cases, this can also damage components of the output circuit 100 and/or load circuit coupled to the output terminal 126. The present invention provides methods and systems for reducing current flow to the output terminal 126 when transients occur at the VDD and/or GND supplies. This tends to reduce the voltage transients that are otherwise generated by the changing current flow in the supply lines.

Another problem in conventional circuits is simultaneous conduction (conduction overlap), between PMOS and NMOS. For example, PMOS may not be fully turned-off when NMOS turns on, and vice-versa. This conduction can cause changes in VDD and GND voltage levels. The present invention provides methods and systems for reducing current flow from VDD to GND.

In accordance with the invention, one or more supplemental output drivers and associated buffer circuits are provided, which, under normal operating conditions, operate similar to the primary buffer circuits 106 and 160 and the primary output drivers 108 and 162. In other words, the primary and supplemental output drivers and associated buffer circuits are designed to provide a desired current to the output terminal 126 under normal operating conditions. Sensing and control circuitry is provided to increasingly disable one or more of the supplemental output drivers when transients are sensed at a supply (e.g., VDD and/or GND). This reduces the current sourced by or to the supplies.

In the example of FIG. 1, the rising edge portion 102 includes supplemental output driver 134, illustrated here with three sub-sections 134a–134c, and corresponding supplemental buffer circuitry 132a–132c. Similarly, the falling edge portion 104 includes supplemental output driver 164, illustrated here with three sub-sections 164a–164c, and corresponding supplemental buffer circuitry 166a–166c.

Supplemental output drivers 134a–c and supplemental buffer circuitry 132a–c operate substantially similar to the primary output driver 108 and primary buffer circuitry 106, respectively. Supplemental output drivers 164a–c and supplemental buffer circuitry 166a–c operate substantially similar to primary output driver 162 and primary buffer circuitry 160, respectively. Thus, under normal operating conditions, when primary output driver 108 sources current to the output terminal, supplemental output driver 134 also sources current to the output terminal 126. Similarly, when primary output driver 162 draws current from the output terminal, supplemental output driver 164 also draws current from the output terminal 126.

In accordance with the invention, sensing and control circuitry is provided to increasingly disable one or more of the supplemental output drivers 134 and/or 164 when transients are sensed at a corresponding supply (e.g., VDD and/or GND). This reduces the current sourced by or to the supplies.

The sensing and control circuitry senses voltage changes with respect to time (dV/dt) at one or more supplies (e.g., VDD and/or GND). For example, in FIG. 1, the rising edge portion 102 includes sensing and control circuits 130a–130c. Similarly, the falling edge portion 104 includes sensing and control circuits 168a–168c. The sensing and control circuits 130a–130c and 168a–168c include capacitances CVDD3, 2, and 1, and CGND 3, 2, and 1, respectively. Capacitances CVDD3, 2, and 1 are coupled to the VDD supply. Capacitances CGND 3, 2, and 1 are coupled to the GND supply. The capacitances CVDD3, 2, and 1, and CGND 3, 2, and 1 sense voltage changes with respect to time at their respective supplies. This is now described at a high level for the rising edge portion 102.

When the VDD voltage increases over time (positive dVDD/dt), current flows across the capacitances CVDD3, 2, and 1. The current depends upon the dVDD/dt and the value of the capacitances CVDD3, 2, and 1. The current is used to control the gate-drive applied to PMOS devices within the supplemental output driver sub-sections 134a–134c. When the dVDD/dt is small, only a few of the PMOS devices within the supplemental output driver sub-sections 134a–134c are disabled. As the dVDD/dt increases, more of the PMOS devices within the supplemental output driver sub-sections 134a–134c are disabled. Thus, the current sourced from the VDD supply to a load connected to the output terminal 126 is limited when the VDD swings above normal operating levels. This reduced transient current through the VDD lines reduces noise that otherwise could be transferred to other I/Os and circuits connected to the VDD line.

In the GND bounce portion 104, when the GND level decreases with time (dV_GND/dt), current flows across capacitances CGND 3,2, and 1. The current depends upon the dV_GND/dt and the value of the capacitances CGND 3,2, and 1. The current is used to control the gate-drive applied to NMOS devices within the supplemental output driver sub-sections 164a–164c. When the dV_GND/dt is small, only a few of the NMOS devices within the supplemental output driver sub-sections 164a–164c are disabled through their gate drive. As the dV_GND/dt increases, more of the NMOS devices within the supplemental output driver sub-sections 164a–164c are disabled. Thus, the current sinked into the GND supply from a load coupled to the output terminal 126 is limited when the GND swings below normal operating levels. This reduced transient current through the GND lines reduces the noise that could otherwise be transferred to other I/O's and circuits connected to this GND line.

Figure 2:
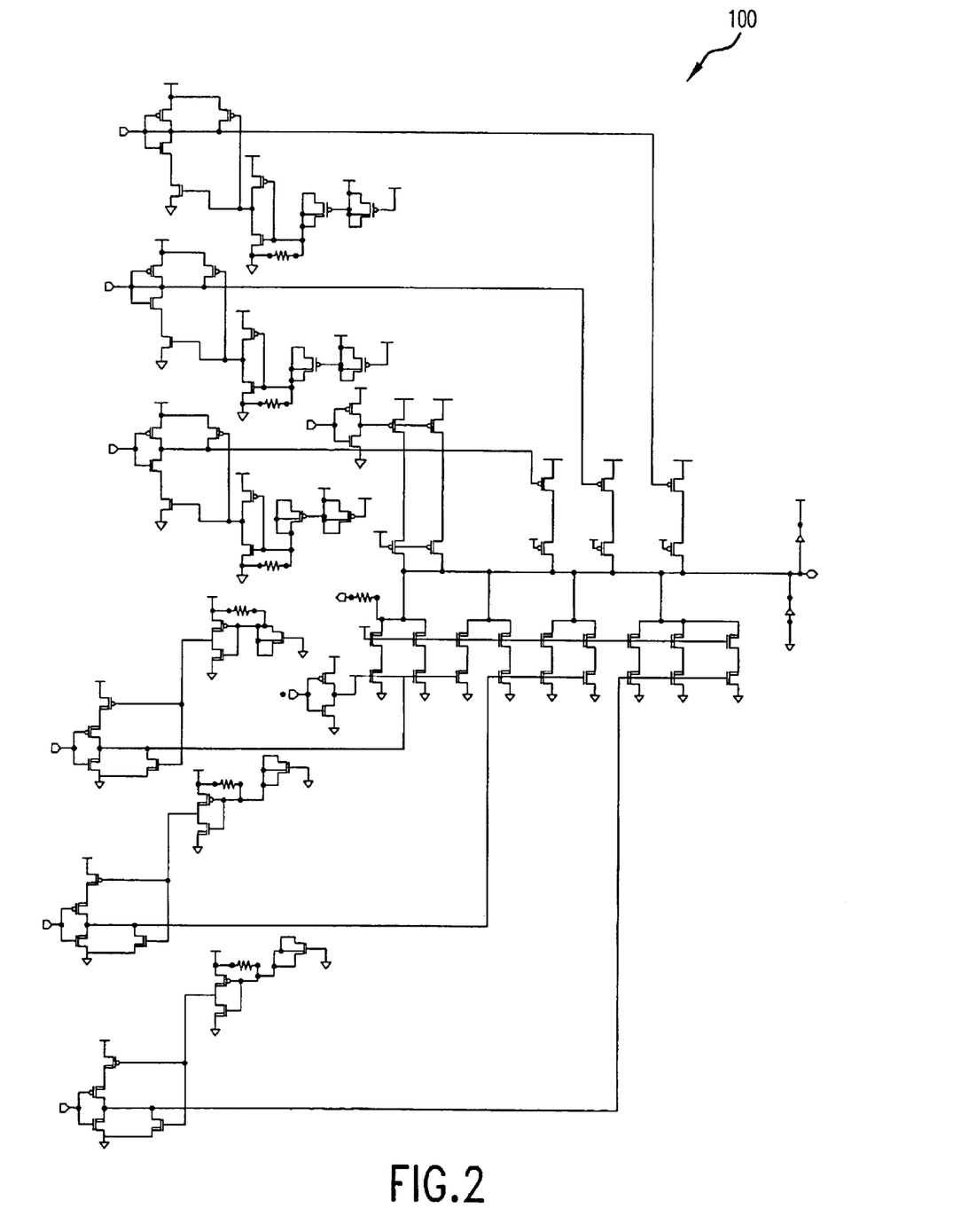
FIG. 2 is another schematic diagram of the example output circuit 100, including capacitor stacks that protect circuit elements from supply voltages, in accordance with the invention.

The CVDD and CGND capacitances can be implemented in a variety of ways including, without limitation, MOS capacitors, and Metal-OxideMetal capacitors. For I/O circuits that use PMOS and NMOS whose gate-oxides cannot withstand the supply voltage, if MOS gate-oxide capacitors are being used, stacks of MOS gate-oxide capacitors with the intermediate potential being fixed at a relatively quiet intermediate supply can be used as shown in FIG. 2.

Referring back to FIG. 1, the sensing and control circuitry are preferably designed with different thresholds so an increasing number of supplemental drivers are disabled as the supply voltage increasingly strays from its normal level. Alternatively, the supplemental output drivers are designed with different thresholds.

Operation of the sensing and control circuits is now described in detail with reference to sensing and control circuit 130a. Sensing circuits 130b and 130c operate in a similar fashion but preferably at different thresholds.

The sensing and control circuit 130a effectively enables or disables the supplemental buffer circuitry 132a The supplemental buffer circuitry 132a receives the input waveform 110, inverts it, and outputs an output waveform 152 on an output line 154. The output waveform 152 on the output line 154 controls the supplemental output driver section 134a. More specifically, as the input waveform 110 rises, the output waveform 152 falls, which increasingly turns on the PMOS device 156 within the supplemental output driver section 134a. The sensing and control circuit 130a increasingly disables the supplemental buffer circuitry 132a by increasingly coupling the output line 154 to a relatively high potential, illustrated here as VDD, through a PMOS device 146. Operation of the sensing and control circuit 130a is now described.

In the sensing and control circuit 130a, the capacitance CVDD3 is implemented with a PMOS device 136 having source and drain terminal coupled to one another at a node 138. A gate terminal of the PMOS device 136 is coupled to the VDD supply. The node 138 is coupled to a relatively low potential, illustrated here as VDDC, through a resistance 150. In operation, when VDD is at it's normal steady state, little or no current flows through the capacitance CVDD3, and thus little or no current flows through the resistance 150. As a result, the node 138 is at the low potential of VDDC. When, however, VDD increases with respect to time (dVVD/dt), current flows through the PMOS device 136, through the resistance 150, to the relatively low potential VDDC. When the current flows through the resistance 150, a positive voltage is generated at the node 138.

The node 138 is coupled to an inverter formed by an NMOS device 140 and a PMOS device 142. The node 138 controls gate terminals of the NMOS device 140 and the PMOS device 142. In operation, when the node 138 is low, which is the case when VDD is at steady state, the NMOS device 140 is off and the PMOS device 142 is on. This couples a node 144 to VDD through the PMOS device 142. In other words, when the node 138 is low, as is the case when VDD is at steady state, the node 144 is high. As the voltage at the node 138 increases, it increasingly turns on the NMOS device 140 and increasingly turns off the PMOS device 142. As the NMOS device 140 turns on, it couples the relatively low potential VDDC to the node 144. As the PMOS device 142 turns off, it isolates the node 144 from VDD. Thus, as the voltage at the node 138 increases, as is the case when VDD rises, the voltage at the node 144 decreases.

The node 144 is coupled to gate terminals of a PMOS device 146 and an NMOS device 148. When the node 144 is high, as is the case when VDD is at steady state, the PMOS device 146 is turned off. This isolates the output line 154 from VDD and the PMOS device 146 is turned off. Furthermore, when the node 144 is high, the NMOS device 148 is on, which couples a drain terminal of an NMOS device within the supplemental buffer circuit 132a to ground. This allows the supplemental buffer circuit 132a to operate as an inverter, controlling the output line 154 that controls the supplemental output driver 134a. In other words, when the VDD is at steady state, the node 138 is low, the node 144 is high, and the sensing and control circuitry 130a does not disable the supplemental output driver 134a.

As the voltage at the node 144 decreases, the NMOS device 148 increasingly turns off, which increasingly isolates the buffer circuitry 132a from the relatively low VDDC. This prevents the buffer circuitry 132a from inverting a high input waveform 110 and outputting it on the output line 154. Furthermore, as the node 144 decreases, the PMOS device 146 increasingly turns on, which increasingly couples VDD to the output line 154. This increasingly turns off the supplemental output driver 134a. In other words, as VDD increases, the sensing and control circuit 130a increasingly disables the supplemental output driver 134a. This limits the current sourced to the output terminal 126 during the transient. The capacitance CVDD3 and the resistance 150 are selected to provide an appropriate threshold for disabling the supplemental output driver 134a.

The sensing and control circuits 132b and 132c operate in a similar fashion, but preferably with different thresholds. The sensing and control circuits 168a–168c also operate in a similar fashion, taking into account that the supply is GND rather than VDD. Thus, when GND is at steady state, the sensing and control circuits 168a–168c do not disable the supplemental output drivers 164a–164c. When, however, the GND falls below the normal level, one or more of the sensing and control circuits 168a–168c increasingly disable one or more of the supplemental output drivers 164a–168c. For example, in the sensing and control circuit 168a, when the GND supply falls below its normal state, current is drawn through the capacitance CGND3. This draws a voltage level at a node 170 down from its normal state of VDD. As the voltage at the node 170 falls, the voltage at a node 172 increases. This increasingly turns on an NMOS device 174, which increasingly couples an output line 176 to the low potential of VSSC. This increasingly turns off NMOS devices within the supplemental output driver 164a, thus reducing the output drive current.

Figure 3:
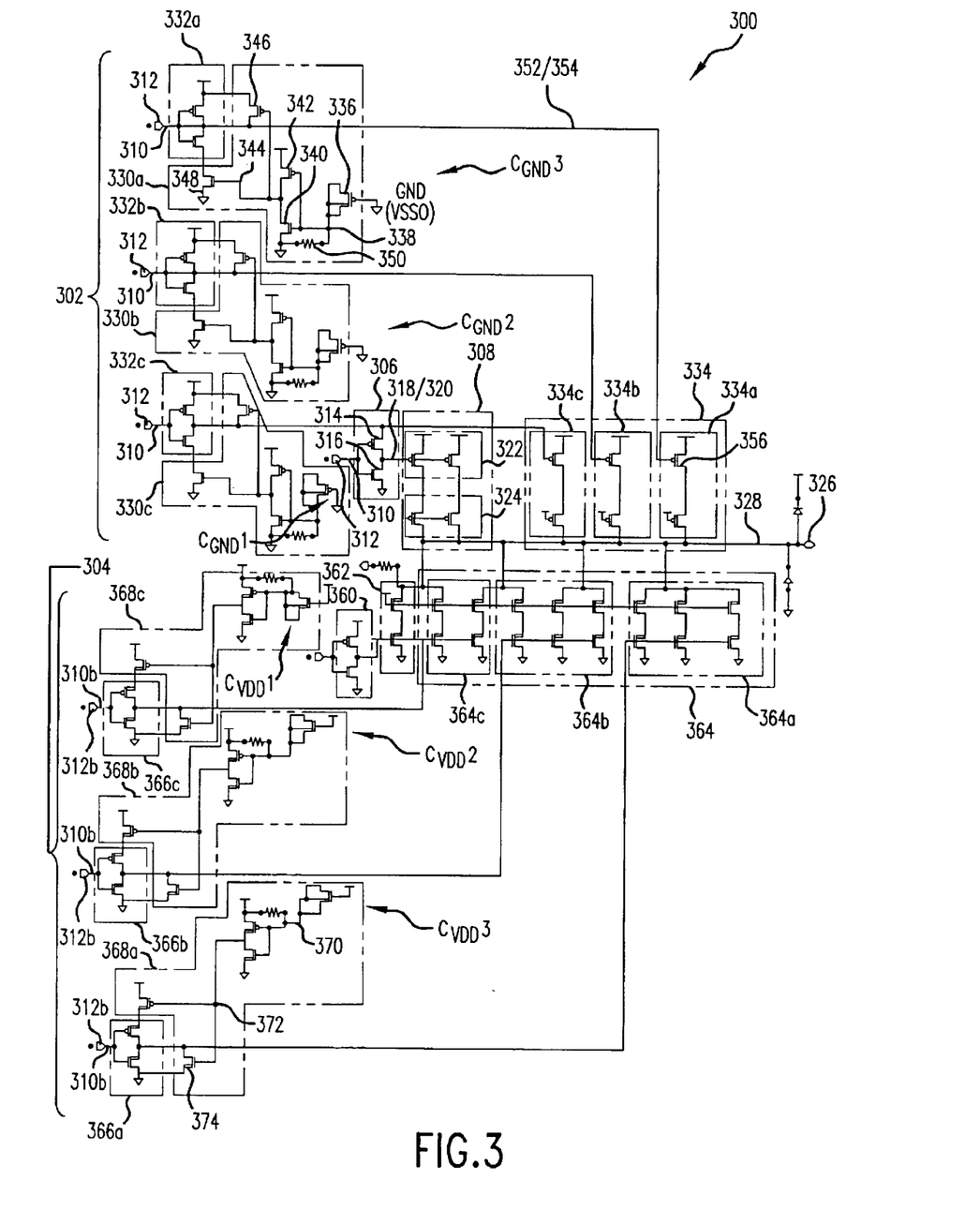
FIG. 3 is a schematic diagram of an example output circuit 300 for limiting conduction between positive and negative output power supplies, in accordance with the invention.

FIG. 3 is a schematic diagram of an example output circuit 300 for limiting conduction between positive and negative output power supplies, in accordance with the invention. In the example of FIG. 3, a rising edge portion 302 includes supplemental output driver 334, illustrated here with three sub-sections 334a–334c, and corresponding supplemental buffer circuitry 332a–332c. Similarly, the falling edge portion 304 includes supplemental output driver 364, illustrated here with three sub-sections 364a–364c, and corresponding supplemental buffer circuitry 366a–366c.

Supplemental output drivers 334a–c and supplemental buffer circuitry 332a–c operate substantially similar to the primary output driver 308 and primary buffer circuitry 306, respectively. Supplemental output drivers 364a–c and supplemental buffer circuitry 366a–c operate substantially similar to primary output driver 362 and primary buffer circuitry 360, respectively. Thus, under normal operating conditions, when primary output driver 308 sources current to the output terminal, supplemental output driver 334 also sources current to the output terminal 326. Similarly, when primary output driver 362 draws current from the output terminal, supplemental output driver 364 also draws current from the output terminal 326.

In accordance with the invention, sensing and control circuitry is provided to increasingly disable one or more of the supplemental output drivers 334 and/or 364 when transients are sensed at a corresponding supply (e.g., VDD and/or GND). This reduces the current sourced by or to the supplies.

The sensing and control circuitry senses voltage changes with respect to time (dV/dt) at one or more supplies (e.g., VDD and/or GND). For example, in FIG. 3, the rising edge portion 302 includes sensing and control circuits 330a–330c. Similarly, the falling edge portion 304 includes sensing and control circuits 368a–368c. The sensing and control circuits 330a–330c and 368a–368c include capacitances CGND3, 2, and 1, and CVDD 3, 2, and 1, respectively. Capacitances CVDD3, 2, and 1 are coupled to the VDD supply. Capacitances CGND 3,2, and 1 are coupled to the GND supply. The capacitances CVDD3, 2, and 1, and CGND 3, 2, and 1 sense voltage changes with respect to time at their respective supplies. This is now described at a high level for the rising edge portion 102.

When current production occurs from VDDO to GND, the VDDO supply drops (negative dVDD/dt) and the GND voltage increases (positive dGND/dt). When the GND voltage increases over time (positive dGND/dt), current flows across the capacitances CGND3, 2, and 1. The current depends upon the dGND/dt and the value of the capacitances CGND3, 2, and 1. The current is used to control the gate-drive applied to PMOS devices within the supplemental output driver sub-sections 334a–334c. When the dGND/dt is small, only a few of the PMOS devices within the supplemental output driver sub-sections 334a–334c are disabled. As the dGND/dt increases, more of the PMOS devices within the supplemental output driver sub-sections 334a–334c are disabled. Thus, the current sourced from the VDD supply to GND is limited when the GND swings above normal operating levels. This reduced transient current from VDD to GND reduces noise that otherwise could be transferred to other I/Os and circuits connected to the VDD line and GND lines.

In the portion 304, when the VDD level decreases with time (dVDD/dt), current flows across capacitances CVDD 3, 2, and 1. The current depends upon the dVDD/dt and the value of the capacitances CVDD 3, 2, and 1. The current is used to control the gate-drive applied to NMOS devices within the supplemental output driver sub-sections 364a–364c. When the dVDD/dt is small, only a few of the NMOS devices within the supplemental output driver sub-sections 364a–364c are disabled through their gate drive. As the magnitude of dVDD/dt increases, more of the NMOS devices within the supplemental output driver sub-sections 364a–364c are disabled. Thus, the current sinked from the VDD supply to GND is limited when the VDD swings below normal operating levels. This reduced transient current from VDD to GND lines reduces the noise that could otherwise be transferred to other I/O's and circuits connected to the VDD and GND lines.

The CVDD and CGND capacitances can be implemented in a variety of ways including, without limitation, MOS capacitors, and Metal-OxideMetal capacitors. For I/O circuits that use PMOS and NMOS whose gate-oxides cannot withstand the supply voltage, if MOS gate-oxide capacitors are being used, stacks of MOS gate-oxide capacitors with the intermediate potential being fixed at a relatively quiet intermediate supply can be used.

Referring back to FIG. 3, the sensing and control circuitry are preferably designed with different thresholds so an increasing number of supplemental drivers are disabled as the supply voltage increasingly strays from its normal level. Alternatively, the supplemental output drivers are designed with different thresholds.

Operation of the sensing and control circuits is now described in detail with reference to sensing and control circuit 330a. Sensing circuits 330b and 330c operate in a similar fashion but preferably at different thresholds.

The sensing and control circuit 330a effectively enables or disables the supplemental buffer circuitry 332a. The supplemental buffer circuitry 332a receives the input waveform 310, inverts it, and outputs an output waveform 352 on an output line 354. The output waveform 352 on the output line 354 controls the supplemental output driver section 334a. More specifically, as the input waveform 310 rises, the output waveform 352 falls, which increasingly turns on the PMOS device 356 within the supplemental output driver section 334a. The sensing and control circuit 330a increasingly disables the supplemental buffer circuitry 332a by increasingly coupling the output line 354 to a relatively high potential, illustrated here as VDD, through a PMOS device 346. Operation of the sensing and control circuit 330a is now described.

In the sensing and control circuit 330a, the capacitance CGND3 is implemented with a PMOS device 336 having source and drain terminal coupled to one another at anode 338. A gate terminal of the PMOS device 336 is coupled to the GND supply. The node 338 is coupled to a relatively low potential, illustrated here as VDDC, through a resistance 350. In operation, when GND is at it's normal steady state, little or no current flows through the capacitance CGND3, and thus little or no current flows through the resistance 350. As a result, the node 338 is at the low potential of VDDC. When, however, GND increases with respect to time (dGND/dt), current flows through the PMOS device 336, through the resistance 350, to the relatively low potential VDDC. When the current flows through the resistance 350, a positive voltage is generated at the node 338.

The node 338 is coupled to an inverter formed by an NMOS device 340 and a PMOS device 342. The node 338 controls gate terminals of the NMOS device 340 and the PMOS device 342. In operation, when the node 338 is low, which is the case when VDD is at steady state, the NMOS device 340 is off and the PMOS device 342 is on. This couples a node 344 to VDD through the PMOS device 342. In other words, when the node 338 is low, as is the case when VDD is at steady state, the node 344 is high. As the voltage at the node 338 increases, it increasingly turns on the NMOS device 340 and increasingly turns off the PMOS device 342. As the NMOS device 340 turns on, it couples the relatively low potential VDDC to the node 344. As the PMOS device 342 turns off, it isolates the node 344 from VDD. Thus, as the voltage at the node 338 increases, as is the case when VDD rises, the voltage at the node 344 decreases.

The node 344 is coupled to gate terminals of a PMOS device 346 and an NMOS device 348. When the node 344 is high, as is the case when GND is at steady state, the PMOS device 346 is turned off. This isolates the output line 354 from VDD and the PMOS device 346 is turned off. Furthermore, when the node 344 is high, the NMOS device 348 is on, which couples a drain terminal of an NMOS device within the supplemental buffer circuit 332a to ground. This allows the supplemental buffer circuit 332a to operate as an inverter, controlling the output line 354 that controls the supplemental output driver 334a. In other words, when the GND is at steady state, the node 338 is low, the node 344 is high, and the sensing and control circuitry 330a does not disable the supplemental output driver 334a.

As the voltage at the node 344 decreases, the NMOS device 348 increasingly turns off, which increasingly isolates the buffer circuitry 332a from the relatively low VDDC. This prevents the buffer circuitry 332a from inverting a high input waveform 310 and outputting it on the output line 354. Furthermore, as the node 344 decreases, the PMOS device 346 increasingly turns on, which increasingly couples VDD to the output line 354. This increasingly turns off the supplemental output driver 334a. In other words, as GND increases, the sensing and control circuit 330a increasingly disables the supplemental output driver 334a. This limits the current sourced from VDD to GND during the transient. The capacitance CGND3 and the resistance 350 are selected to provide an appropriate threshold for disabling the supplemental output driver 334a.

The sensing and control circuits 332b and 332c operate in a similar fashion, but preferably with different thresholds. The sensing and control circuits 368a–368c also operate in a similar fashion, taking into account that the sensed supply is VDD rather than GND. Thus, when VDD is at steady state, the sensing and control circuits 368a–368c do not disable the supplemental output drivers 364a–364c. When, however, the VDD falls below the normal level, one or more of the sensing and control circuits 368a–368c increasingly disable one or more of the supplemental output drivers 364a–368c. For example, in the sensing and control circuit 368a, when the VDD supply falls below its normal state, current is drawn through the capacitance CVDD3. This draws a voltage level at a node 370 down from its normal state of VDD. As the voltage at the node 370 falls, the voltage at a node 372 increases. This increasingly turns on an NMOS device 374, which increasingly couples an output line 376 to the low potential of VSSC. This increasingly turns off NMOS devices within the supplemental output driver 364a, thus reducing the output drive current.

Figure 4:
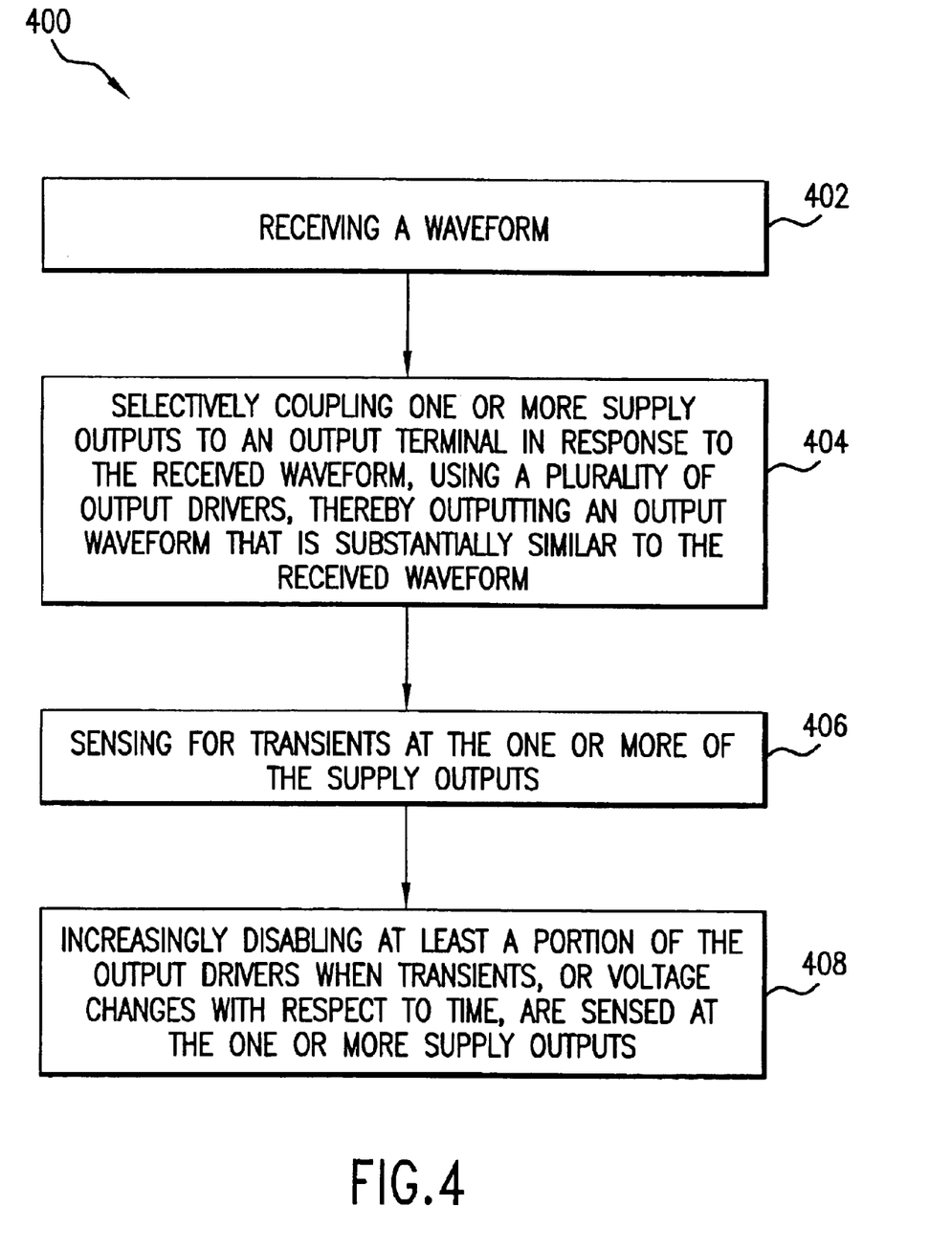
FIG. 4 is an example process flowchart 400 for limiting supply bounce in accordance with the invention.

FIG. 4 illustrates a process flowchart 400 in accordance with an aspect of the invention. The process flowchart 400 is described with reference to the example output circuit 100 illustrated in FIGS. 1 and 2. The process flowchart 400 is not, however, limited to the example output circuit 100 illustrated in FIGS. 1 and 2. Based on the description herein, one skilled in the relevant art(s) will understand that the process flowchart 400 can be implemented with other circuits as well. Such other implementations are within the spirit and scope of the present invention.

The process begins at step 402, which includes, receiving a waveform. In the example of FIG. 1, the waveform is received at the input terminals 112.

Step 404 includes selectively coupling one or more supply outputs to an output terminal in response to the received waveform, using a plurality of output drivers, thereby outputting an output waveform that is substantially similar to the received waveform. The one or more supply outputs include a positive voltage supply output and/or a ground supply output, and the output drivers include a plurality of PMOS output drivers and a plurality of NMOS output drivers. The PMOS output drivers include source and drain terminals that are coupled between the positive voltage supply and the output terminal. The NMOS output drivers include source and drain terminals that are coupled between the ground supply and the output terminal. In this embodiment, step 404 includes selectively providing rising-edge and falling-edge output current drive to the output terminal in response to the received waveform using the PMOS output drivers and the NMOS output drivers, respectively. In the example of FIG. 1, the rising edge output drivers 134 and the falling edge output drivers 164 output a waveform 128 at the output terminal 126.

Step 406 includes sensing for transients at the one or more of the supply outputs. Step 406 can be performed by, for example, sensing for voltage changes with respect to time at the one or more supply outputs. This is illustrated in the example of FIG. 1 by the rising edge sensing and control circuitry 130 and the falling edge sensing and control circuitry 168.

Step 408 includes increasingly disabling at least a portion of the output drivers when transients, or voltage changes with respect to time, are sensed at the one or more supply outputs. In the example of FIG. 1, the sensing and control circuitry 130a–c are preferably implemented with different thresholds so that each sensing and control circuitry 130a–c increasingly disables a corresponding output driver 134a–c at different transient levels. Similarly, the sensing and control circuitry 168a–c are preferably implemented with different thresholds so that each sensing and control circuitry 168a–c increasingly disables a corresponding output driver 164a–c at different transient levels. This reduces the current in the supply lines, which tends to reduce the sensed transients that are caused by switching-induced currents in the supply lines.

The present invention has been described above with the aid of functional building blocks illustrating the performance of specified functions and relationships thereof The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, monolithic integrated circuits, and the like or any combination thereof.

When used herein, the terms "connected" and/or "coupled" are generally used to refer to electrical connections. Such electrical connections can be direct electrical connections with no intervening components, and/or indirect electrical connections through one or more components.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A system for isolating supply noise caused by variations in supply voltage from a system output, the system having a first supply and a second supply, comprising:

a plurality of buffers coupled to a system input;

a plurality of sensing and control modules wherein at least one of the plurality of sensing and control modules is coupled to the first supply and at least one of the plurality of sensing and control modules is coupled to the second supply, each sensing and control module coupled to one of the plurality of buffers; and a plurality of output drivers coupled to the system output, each output driver coupled to one of the plurality of buffer circuits and one of the plurality of sensing and control modules, wherein the plurality of sensing and control modules increasingly disable at least a portion of the plurality of output drivers as voltage changes with respect to time increase at the first supply or the second supply.

2. The system of claim 1 wherein each sensing and control module comprises:

a sensing module that detects and responds to supply voltage changes with respect to time; and a control module coupled to the sensing module that controls the operation of the output driver coupled to the sensing and control module.

3. The system of claim 2 wherein the sensing module comprises a capacitance coupled in series with a resistance.

4. The system of claim 3 wherein each sensing module has a different threshold for responding to supply voltage changes with respect to time.

5. The system of claim 1 wherein the first supply is a positive voltage.

6. The system of claim 5 wherein the second supply is ground.

7. A system for isolating supply noise cause by variations in supply voltage from a system output, the system including a first supply, a second supply, and a plurality of output drivers coupled to the system output, comprising:

means for detecting and responding to supply voltage changes with respect to time;

means for disabling one or more of the plurality of output drivers when a voltage change with respect to time is sensed at the first supply; and means for disabling one or more of the plurality of output drivers when a voltage change with respect to time is sensed at the second supply.

8. The system of claim 7 wherein the voltage change with respect to time sensed at the first supply is positive.

9. The system of claim 7 wherein the first supply is a positive voltage.

10. The system of claim 9 wherein the second supply is ground.

11. The system of claim 10 wherein the voltage change with respect to time sensed at the first supply is negative and the voltage change with respect to time sensed at the second supply is positive.

12. A method for isolating supply noise caused by variations in supply voltage from an output of a system, wherein the system includes a plurality of output drivers coupled to the system output, the method comprising:

detecting a change in the supply voltage with respect to time; and disabling one or more of the plurality of output drivers based on the magnitude of the voltage change detected.

13. The method of claim 12 wherein the step of detecting a change in the supply voltage comprises detecting a change in a first supply and a second supply.

14. The method of claim 13 wherein the detecting step comprises detecting a positive change at the first supply with respect to time.

15. The method of claim 13 wherein the detecting step comprises:

detecting a negative voltage change at the first supply with respect to time; and detecting a positive voltage change at the second supply with respect to time.

\* \* \* \* \*